United States Patent

Milkovic

[11] 4,056,775
[45] Nov. 1, 1977

[54] ELECTRONIC KWH METER HAVING INTERNAL POWER SUPPLY AND ERROR CORRECTION SYSTEM

[75] Inventor: Miran Milkovic, Scotia, N.Y.

[73] Assignee: General Electric Company, Schenectady, N.Y.

[21] Appl. No.: 757,800

[22] Filed: Jan. 7, 1977

[51] Int. Cl.² .......................................... G01R 11/32
[52] U.S. Cl. ............................. 324/142; 324/140 R; 328/162; 331/111
[58] Field of Search ........... 324/142, 141, 140, 140 R; 328/160, 173, 162

[56] References Cited

U.S. PATENT DOCUMENTS

| | | | |
|---|---|---|---|
| 3,947,763 | 3/1976 | Milkovic | 324/142 |
| 3,975,682 | 8/1976 | Mayfield | 324/142 |
| 3,976,941 | 8/1976 | Milkovic | 324/142 |
| 3,976,942 | 8/1976 | Mayfield | 324/142 |

*Primary Examiner*—John Kominski
*Attorney, Agent, or Firm*—Robert E. Brunson; P. L. Schlamp

[57] ABSTRACT

Metering kWh in an electrical system is accomplished by generating pairs of analog signals representing current and voltage variables. A comparator compares an analog signal which is proportional to the voltage in the system with a relatively high frequency triangular waveform. The output of the comparator, which is a pulse-width modulated signal having a pulse duration proportional to the amplitude of the voltage in the system, is multiplied by a signal which is proportional to the current in the system. The output of the multiplier is integrated to thereby provide a signal which is proportional to the energy consumed in the system. The output of the integrator is converted to a pulse train having each pulse proportional to the kilowatt hours consumed in the electrical system. A mechanical accumulation and display means records the total energy consumed and is driven in response to the output of the analog-to-pulse rate converter. The pulse output of the converter closes a switch which couples a relatively large amount of current to a motor winding which advances the mechanical display. Power for the active elements in the system, including the drive for the mechanical display, is derived from the system being measured by means of an internally provided power supply. Error correction is provided by means of a switching means which reverses the phase of the triangular waveform and the first analog signal by reversing the connections of these signals to the comparator.

10 Claims, 3 Drawing Figures

ELECTRONIC KWH METER HAVING INTERNAL POWER SUPPLY AND ERROR CORRECTION SYSTEM

BACKGROUND OF THE INVENTION

This invention relates to an improved method and apparatus for metering active electrical energy by solid state electronic techniques and in particular, relates to an improved meter having internal error correction and power supply means for the active components of the meter.

Electrical energy (kWh) has been and continues to be metered with the familiar rotating disc-type of meter. In addition, the instrumentation and metering arts include proposed systems having apparatus employing electronic and solid state devices for measuring power and energy. In such apparatus, the electronic and solid state devices replace the conventional rotating disc.

Further, there have been disclosed metering systems for metering electrical energy in an electrical system which involves producing analog signals from line currents and voltages. Pairs of analog signals representing current and voltage variables are processed in time division multiplier networks which multiply the analog signals to provide a series of width and amplitude modulated pulse signals each representing instantaneous partial power. Pulse signals from different multiplier networks are summed to provide another series of pulse signals each representing instantaneous total power. The series of pulse signals representing instantaneous total power are processed through a low pass filter to provide another signal representative of average total power in the system. Subsequently, the signal representing average total power is processed in an analog-to-pulse rate converter which produces a series of output pulse signals each representing a quantized amount of electrical energy. A stepping switch and register perform conventional accumulation, storage and display functions in response to the series of output pulse signals delivered thereto. None of these systems includes a method and apparatus for providing, in combination, a source of internal power for driving the active circuit components of the metering system, while at the same time providing internal error correction, and none of these systems discloses or suggests a means wherein an internal power supply provides sufficient energy for efficiently and effectively driving a mechanical display means.

It therefore it an object of this invention to provide an improved method and apparatus for metering kWh in a solid state electronic metering system wherein the metering system has an internal power supply with internal error correction.

It is another object of this invention to provide an improved method and apparatus for metering electrical energy wherein the metering system has an internal power supply with internal error correction wherein the power supply provides energy sufficient for driving a mechanical energy display means.

SHORT STATEMENT OF THE INVENTION

Accordingly, this invention relates to an electronic kWh meter for metering electrical energy in a solid state electrical energy metering system wherein the apparatus includes a transformer for generating at least a first analog signal representative of a voltage in the system being measured and a current transformer for generating a second analog signal representative of a current in the system. A comparator compares a relatively high frequency triangular waveform signal with the first analog signal to derive at the output thereof a width modulated signal having a pulse width which is proportional to the amplitude of the voltage in the system. The output of the comparator is multiplied by the second analog signal to derive at the output of the multiplier a signal having a pulse width which is proportional to the magnitude of the voltage in the system and having an amplitude which is proportional to the current in the system. This signal is integrated to provide a signal which is representative of the average total system energy consumed. An analog-to-pulse rate converter converts the output of the integrator into a series of output pulse signals wherein each pulse is representative of a quantized amount of electrical energy. The pulse output of the converter controls a switch which permits a relatively large amount of current to be conducted through a stepping motor. The stepping motor drives a mechanical display which accumulates and records the total energy consumed in the electrical system. The output of the converter is also utilized to reverse the phase of the first analog signal coupled to the comparator to thereby provide for error correction in the integration step. Power for the active components of the metering system, including the stepping motor, is derived from the voltage detected in the system, with the power supply providing a plurality of D.C. voltages for driving the various active components in the circuit. In addition, the power supply provides a current storage means for driving the stepping motor in response to output pulses generated by the analog-to-pulse rate converter.

BRIEF DESCRIPTION OF THE DRAWINGS

Other objects, features and advantages of the present invention will now become more fully apparent from the following detailed description of the preferred embodiment, the appended claims and the accompanying drawings in which:

DETAILED DESCRIPTION OF THE PREFERRED EMBODIMENT

Figures 1A, 2:
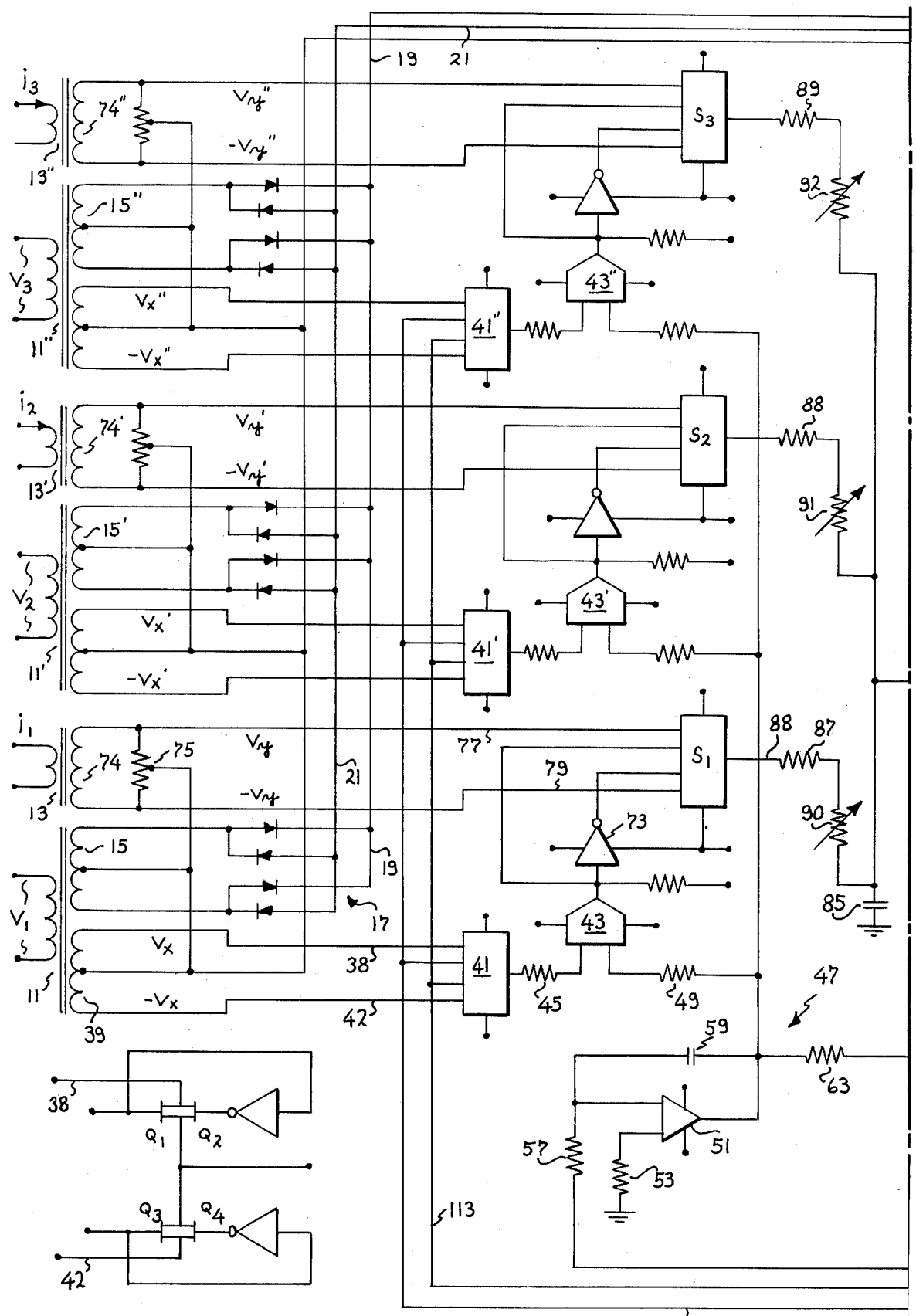
FIG. 1A is a schematic block diagram of a portion of the metering system of the present invention.
FIG. 2 is a schematic diagram of a bipolar switch utilized in the meter of FIGS. 1A and 1B.
Figure 1B:
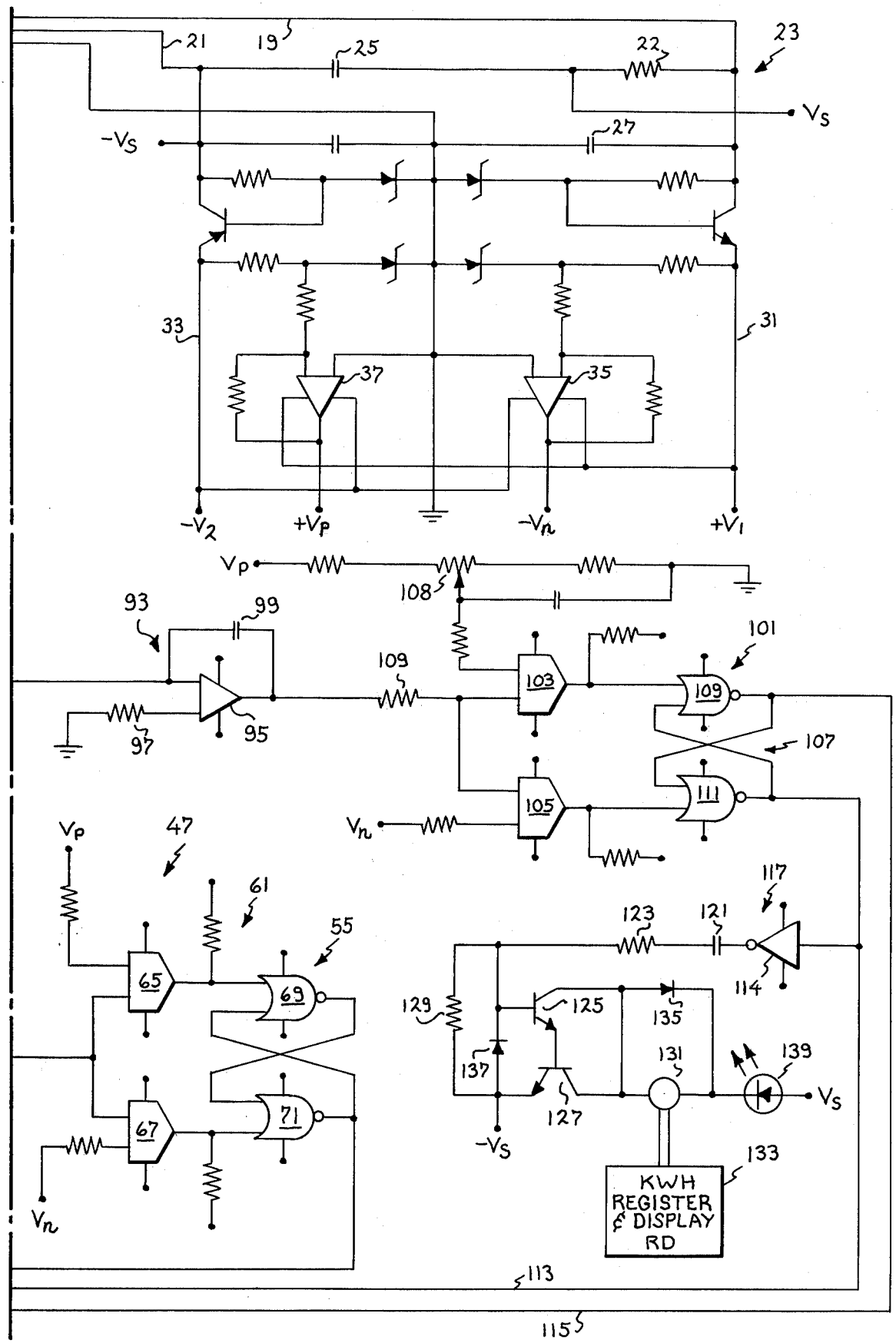
FIG. 1B is a schematic block diagram of the other portion of the metering system of the present invention.

Refer now to FIGS. 1A and 1B where there is a schematic block diagram of the preferred embodiment of the present invention. The electrical system in which power energy is being measured by the meter of the present invention may be of any type including, for example, a conventional 60 Hz power distribution system. Further, the system can be a single phase or polyphase system with the preferred embodiment of the meter being capable of measuring power and energy in a polyphase system. The voltage $V_1$ in one phase of the electrical system is detected by means of a potential transformer 11, while the current $i_1$ in this phase of the system is detected by means of a current transformer 13. The secondary of the potential transformer 11 includes a first center tap winding 15 wherein the center tap of the winding is connected to a common reference point which in the present invention is ground. The respective ends of the winding 15 are connected across a full-wave rectifier 17 which, as illustrated, is in the form of a conventional diode bridge rectifier. One output of the bridge rectifier 17 is connected to a positive voltage line 19 while the other output of the bridge rectifier is connected to a negative voltage line 21. These lines are connected to a filtering and power regulation circuit generally designated by the numeral 23, as illustrated in FIG. 1B. The outputs of the bridge rectifier 17 are shown connected across resistor 22 and capacitor 25 via lines 19 and 21. The capacitor 25 serves as a storage means for, as will be seen hereinbelow, driving the stepping motor of the accumulating and display device. The output of the bridge rectifier is also coupled across filtering capacitors 27 and 29 which provide a D.C. input to substantially identical regulators 31 and 33. Regulator 31 provides a first positive power supply voltage $V_1$ and a second negative power supply voltage $V_n$. Regulator 33 provides a first positive power supply voltage $V_p$ and a second negative power supply voltage $V_2$. The operation of the regulators 31 and 33 is in accordance with conventional techniques known in the art with the power supply voltages $V_1$ and $V_2$ driving the amplifiers 35 and 37 in the regulators 31 and 33, respectively.

Referring back to FIG. 1A, the other secondary winding 39 of the potential transformer 11 is also center tapped with the center tap of the secondary being connected to the ground reference potential of the meter. The ends of the secondary winding 39 are connected to a switching circuit 41 which alternately connects one of the outputs of the secondary winding 39 to one input of comparator 43 via input resistor 45. As shown in FIG. 2, the switch 41 is bipolar and includes a first pair of complementary MOS field effect transistors Q1 and Q2 which function as a first switching element and a second pair of complementary MOS field effect transistors Q3 and Q4 which function as a second switching element. Transistor Q1 receives at its gate a first pulse signal, while transistor Q2 receives a signal which is logically inverted with respect to the signal received at the gate of transistor Q1. At the same time, transistor Q3 receives a signal of opposite polarity from that received at the gate of transistor Q1, while the input to the gate of transistor Q4 is inverted with respect to that at the input gate of transistor Q3. Thus, when the signal coupled to the base of transistor Q1 is high or positive, the transistors Q1 and Q2 are turned on or are conducting so that the signal which appears on line 38 is coupled to the comparator 43 via resistor 45. At the same time, the signal coupled to the gate of transistor Q3 is the complement to the signal coupled to the gate of transistor Q1 and, accordingly, transistors Q3 and Q4 are turned off. When the signal at the input of transistor Q1 goes low, the signal at the input of transistor Q3 goes high, thereby turning on transistors Q3 and Q4. The signal on line 42 is then coupled via transistors Q3 and Q4, and resistor 45, to the comparator 43.

Referring back to FIGS. 1A and 1B, the other input to the comparator 43 is a relatively high frequency triangular waveform generated by triangular waveform generator 47 which signal is coupled to the comparator 43 via resistor 49. The triangular waveform generator 47 includes an integrator which comprises an amplifier 51 having the in-phase input thereto grounded via resistor 53 and having the inverted input connected to the output of flipflop 55 via resistor 57. The feedback capacitor 59 is connected across the inverted input of the amplifier 51 and the output thereof to provide a conventional integrator circuit. The output of the integrator circuit is coupled to one input of the comparator 43 via the resistor 49 and is also coupled to a pulse generating circuit 61 via resistor 63. The pulse generation circuit 61 includes a first comparator 65 and a second comparator 67. The other input to the first comparator 65 is a fixed positive voltage $V_p$ derived from the voltage regulator 33, and the other input to the comparator 67 is a constant negative voltage $V_n$ derived from the regulator 31. The outputs of the comparators 65 and 67 are connected to the NOR gates 69 and 71, respectively. The NOR gates 69 and 71 are connected in a bistable configuration with the output of NOR gate 71 being connected back to the inverting input of amplifier 51 via resistor 57.

In operation, assume that the integrator is integrating upwardly in a positive direction, i.e., generating the positive-going portion of the triangular waveform. When the output voltage of the integrator reaches the voltage level $V_p$, comparator 65 generates an outpuut pulse to switch the flipflop 55. A pulse is thereby derived at the output of NOR gate 71 which causes the integrator to start integrating downwardly. As the integrator integrates downwardly, i.e., generates an output voltage which goes in a negative direction, the negative-going portion of the triangular waveform is generated. When the integrator provides a output voltage which reaches a level $V_n$, the comparator 67 generates an output signal which is coupled to NOR gate 71 to reset the flipflop 55. When this occurs, the output of the flipflop 55 is switched to thereby cause the integrator to integrate upwardly again. This cycle repeats itself at a fairly rapid rate compared to the frequency of the line voltage in the electrical system. As an example, in the preferred embodiment the line voltage may be the conventional 60 cycle voltage provided in electrical distribution systems. In such a case, the triangular waveform generator 47 preferably generates a triangular waveform having a frequency of about 10 kHz.

Referring back to the comparator 43, the output of the comparator is a pulse train wherein each of the pulses has a time duration which is proportional to the instantaneous amplitude of the line voltage in the electrical system being measured. Thus, the output of the comparator 43 is a pulse width modulated signal having a duration which is proportional to the line voltage $V_1$. This signal is coupled to a switching circuit $S_1$ which, preferably, is of the same type as switching circuit 41. The output of comparator 43 is also inverted by inverter 73 to provide a complementary switching signal input to the switch $S_1$.

The secondary 74 of the current transformer 13 has a center tapped resistor 75 connected thereacross. The center tap of the resistor is connected to ground so that a first analog voltage $V_y$ is provided on line 77, and a second analog voltage $V_y$ is provided on line 79. These voltages are proportional in magnitude to the current detected in the system, but are 180° out of phase with respect to one another. The voltage $V_y$ has substantially the same phase as the current $i_1$. It can be seen that the switch $S_1$ serves to connect either the voltage $V_y$ or $-V_y$ to the output line 81, depending upon the output of the comparator 43. As an example, when the output of the comparator 43 is high, the voltage $V_y$ is coupled to the output line 81, whereas when the output of the comparator 43 is low the voltage $-V_y$ is connected to the output line 81. The output signal on line 81 is the product of the in-phase components of the current $i_1$ and voltage $V_1$ in the particular phase being detected. Thus, the signal on line 81 is a pulse width amplitude modulated signal having an amplitude which is proportional to the current $i_1$ with a pulse width proportional to the amplitude of the voltage $V_1$.

A similar multiplying circuit including switching circuits 41' and 41", comparators 43' and 43", as well as switches $S_2$ and $S_3$ are provided for other phases in the polyphase system in which power and energy consumption is being measured. Thus, in the second phase of the polyphase system, the voltage variable $V_2$ is detected by means of transformer 11' and converted to a pair of analog signals $V'_x$ and $-V'_x$ which signals are selectively coupled to the comparator 43' by means of switch 41'. The current $i_2$ is converted to a pair of analog signals $V'_y$ and $-V'_y$ by means of secondary winding 74'. These signals are selectively coupled to the output of switch $S_2$ depending upon the output of comparator 43'. The same arrangement is provided for deriving analog signals proportional to the voltage variable $V_3$ and the current variable $i_3$ in the third phase of the system being detected. The output signals from the switches $S_1$, $S_2$ and $S_3$ are summed and averaged by means of a filter circuit which includes a capacitor 85, resistors 87 - 89, and variable resistors 90 - 92. The resistors 90 - 92 are for purposes of calibration. The voltage across the capacitor 85 is coupled to an integrator 93 which is of conventional design and includes an amplifier 95 having the in-phase terminal thereof connected to ground via resistor 97 and, in addition, includes a feedback capacitor 99. The input to the integrator is a D.C. signal having an amplitude which is proportional to the sum of the products of the in-phase components of the current and voltages in each of the phases of the electrical system being measured. The output of the integrator is a signal which is proportional to the energy being consumed in the electrical system. This signal is converted to a pulse train by means of a pulse generating circuit 101. The pulse generating circuit 101 is somewhat similar to the pulse generator 61 in the triangular waveform generator 47. Thus, the pulse generating circuit includes comparators 103 and 105 and a bistable circuit 107. The output of the integrator is coupled to each of the comparators 103 and 105 via resistor 109. A constant positive voltage $V_p$ is coupled to the other input of comparator 103 via calibration variable resistor 108 and a constant negative voltage $V_n$ is coupled to the other input of comparator 105. The output of comparator 103 is connected to one input of NOR gate 109 and the output of comparator 105 is connected to one input of NOR gate 111. Each of the NOR gates 109 and 111 are connected in a conventional bistable mode.

In operation, assume that the integrator 93 is integrating in a positive direction. When the voltage at the output of the integrator equals $V_p$, or some lower value depending on the setting of variable resistor 108, the comparator 103 provides an output signal for setting the flipflop 107. A pulse is thus generated which is coupled to each of the switches 41, 41' and 41" on line 113, while the signal on line 115 which is also coupled to the switches 41 41" goes low. The signal on line 113 is also coupled to the recording and display drive circuit generally designated by the numeral 117. The pulse is inverted by inverter 115 and differentiated by the circuit including the capacitor 121, resistor 123, and transistors 125 and 127. Thus, each time the output of NOR gate 111 goes positive, the capacitor 121 is charged through amplifier 114 and resistors 123 and 129 and the base of transistor 125. Transistors 125 and 127 both turn on during this period so that the stepping motor winding 131 is connected across the capacitor 25 in the power supply circuit. Thus, a voltage of $2V_s$ serves to drive the stepping motor winding which in the preferred embodiment requires a current of about 100 millamps for a duration of 40 milliseconds to provide a unit incremental change in the mechanical recording and display mechanism 133. After this time, the capacitor 121 is fully charged and, accordingly, the transistors 125 and 127 turn off. Diode 135 prevents an over-voltage build-up across the stepping motor winding when the current is switched off. Diode 137 prevents reverse base emiter breakdown in the transistors 125 and 127. The light emitting diode 139 provides a visual indication of the energization of the stepping motor winding 131.

The kWh register and display circuit 133 is of conventional design and provides a record and display of the total energy being consumed in the polyphase system.

It should be understood that the meter of the present invention could be used in connection with metering energy consumption in a single-phase electrical system, as well as in a polyphase system. It further should be appreciated that the power supply voltages can be derived from a plurality of secondary windings 15, 15' and 15", or from only one secondary winding 15. The output voltages of the voltage supply provide the power supply voltages for driving the active circuit components of the meter of the present invention. While the present invention has been disclosed in connection with a preferred embodiment thereof, it should be understood that there may be other obvious modifications thereof which fall within the spirit and scope of the invention as defined by the appended claims.

What is claimed is:

1. An electronic kWh meter for metering electrical energy in a system comprising means for generating at least a first analog signal representative of a voltage in said system and at least a second analog signal representative of a current in said system;

at least one multiplier for producing an output signal representative of the product of said first and second analog signals, said multiplier comprising means for generating a cyclicly varying reference signal;

comparator means for linearly superimposing said reference signal and said first analog signal to form a pulse train which is width modulated in accordance with the comparison of said reference signal with said first analog signal, a switching means responsive to said pulse train for coupling said second analog signal to the output of said multiplier to form an output pulse train representative of the instantaneous power which is width modulated in accordance with the first analog signal and amplitude modulated in accordance with the second analog signal;

integrating means to which the output of said at least one multiplier is connected for forming an output representative of the average total system energy consumed;

means for converting said average total system power output signal of said integrating means into a series of output pulse signals wherein each pulse is representative of a quantized amount of electrical energy;

means for accumulating said pulses representative of quantized amounts of electrical energy;

means for generating a display proportional to the accumulated quantized amounts of the electrical energy;

power conversion means responsive to said voltage of said system for generating at least one D.C. power supply signal, said power supply signal driving the active circuit components of said meter; and error correction means responsive to the output pulses of said converter for reversing the phase of said first analog signal connected to said comparator to thereby correct integration errors in said meter.

2. The meter of claim 1 wherein said means for accumulating said pulses comprises a mechanical display means;

means for driving said mechanical display means; and means for energizing said driving means each time an output pulse is generated by said analog-to-pulse rate converting means.

3. An electronic meter for measuring energy consumed in an electrical system comprising means for generating first and second analog signals, said signals being proportional to a current in said system and said first analog signal being 180° out of phase with respect to said second analog signal;

means for generating third and fourth analog signals proportional to a voltage in said system, said third analog signal being 180° out of phase with respect to said fourth analog signal;

means for generating a relatively high frequency triangular waveform signal;

a comparator, said triangular waveform being coupled to one input of said comparator;

switching means for selectively coupling said third or said fourth analog signal to the other input of said comparator, the output of said comparator being a pulse width modulated signal having a pulse width proportional to the amplitude of said voltage in said system;

means for multiplying said pulse width modulated output signal of said comparator with a signal proportional to said first or said second current proportional analog signals, the output of said multiplier having an amplitude proportional to the electrical current in said system and having a pulse width proportional to the amplitude of the voltage in said system;

an integrator, said integrator being connected to the output of said multiplier, the output of said integrator being proportional to the energy consumed in said system;

a pulse generating circuit, the input of said circuit being connected to said integrator to thereby convert the output of said integrator to a pulse train having each pulse proportional to energy consumed in said system;

power conversion means responsive to said voltage of said system for generating at least one D.C. power supply signal, said power supply signal driving the active circuit components of said meter;

means connected to said pulse generating circuit for recording and displaying the energy consumed in said electrical system, said display means including a mechanical display means, means responsive to said power supply voltage for driving said mechanical display means and means for energizing said driving means each time an output pulse is generated by said pulse generating circuit; and error correction means responsive to the output pulses of said converter means for operating said switching means to alternately selectively connect said third or said fourth analog signals to said comparator to thereby correct integration errors in said meter.

4. The electronic meter of claim 3 wherein said means for driving said mechanical display means comprises a stepping motor having an energization winding and wherein said means for energizing said driving means comprises a second switching means, said switching means being responsive to the output pulses of said pulse generating circuit for coupling said first voltage to said energizing winding.

5. The electronic meter of claim 4 wherein said pulse generating circuit comprises means for determining when the voltage level at the output of said integrator reaches a first predetermined positive level;

means for detecting when the output of said integrator reaches a second negative level; and means responsive to said detecting means for generating an output pulse when said predetermined positive and negative levels are reached.

6. The electronic meter of claim 5 wherein said multiplying means comprises a switch, said switch selectively connecting said first or said second analog signals to said integrator in accordance with the output of said comparator.

7. An electronic meter for measuring energy consumed in a polyphase electrical system comprising;

a plurality of means for generating first and second analog signals, said signals being proportional to the current in each phase of said system wherein said first analog signals are 180° out of phase with respect to said second analog signals;

a plurality of means for generating third and fourth analog signals, said signals being proportional to the voltage in each phase of said system wherein said third analog signals are 180° out of phase with respect to said fourth analog signals;

means for generating a relatively high frequency triangular waveform signal;

a plurality of comparators, one for each phase of said polyphase system, said triangular waveform being coupled to one input of each comparator;

a plurality of switching means for selectively coupling said third or said fourth analog signals to one input of each of said comparators, the output of said comparators being a pulse width modulated signal wherein each signal has a pulse width proportional to the amplitude of the voltage in the corresponding phase of said polyphase system;

a plurality of means for multiplying said pulse width modulated output signals of said comparators with the corresponding first and second current proportional analog signals for each phase, the output of said multipliers having an amplitude proportional to the amplitude of the electrical current in a corresponding phase of said system and having a pulse width proportional to the amplitude of the electrical voltage in the corresponding phase of said system;

means for summing said outputs of said multiplying means;

an integrator connected to said summing means, the output of said integrator being proportional to the energy consumed in said system;

a pulse generating circuit, the input of said circuit being connected to said integrator to thereby convert the output of said integrator to a pulse train having each pulse proportional to energy consumed in said system;

means connected to said pulse generating circuit for recording and displaying the energy consumed in said electrical system, said means including a mechanical display means, means for driving said mechanical display means and means for energizing said driving means each time an output pulse is generated by said pulse generating circuit means;

power conversion means responsive to said voltage in said system for generating at least one D.C. power supply signal, said power supply signal driving the active circuit components of said meter; and error correction means responsive to the output pulses of said converter for operating said plurality of switching means to alternately selectively connect said third or said fourth analog signals to said comparator.

8. The electronic meter of claim 7 wherein said analog-to-pulse rate converter comprises means for determining when the voltage level at the output of said integrator reaches a first predetermined positive level;

means for detecting when the output of said integrator reaches a second negative level; and means responsive to said detecting means for generating an output pulse when said predetermined positive and negative levels are reached.

9. The electronic meter of claim 8 wherein said multiplying means each comprises a switch, said switch selectively connecting said first or second analog signals to said summing means in accordance with the output of said comparator.

10. The electronic meter of claim 8 wherein said means for driving said mechanical display means comprises a stepping motor having an energized winding and wherein said means for energizing said driving means comprises switching means responsive to said pulses from said pulse generating circuit means for coupling said D.C. power supply signal to said energizing winding of said stepping motor.

* * * * *